United States Patent [19]

Ikeda

[11] Patent Number: 5,278,526
[45] Date of Patent: Jan. 11, 1994

[54] LAMINATED LC ELEMENT AND METHOD FOR MANUFACTURING THE SAME

[76] Inventor: Takeshi Ikeda, 2-5-6-213, Sanno, Ohta-ku, Tokyo, Japan

[21] Appl. No.: 904,677

[22] Filed: Jun. 26, 1992

Related U.S. Application Data

[63] Continuation of Ser. No. 630,234, Dec. 19, 1990, Pat. No. 5,126,707.

[30] Foreign Application Priority Data

Dec. 25, 1989 [JP] Japan ............................ 1-335694

[51] Int. Cl.$^5$ ............................................. H03H 7/00
[52] U.S. Cl. ................................... 333/185; 333/184; 336/200
[58] Field of Search ................... 333/185, 184, 167, 181–183; 336/200, 232; 361/401, 321

[56] References Cited

U.S. PATENT DOCUMENTS 4,904,967  2/1990  Morii et al. .................. 333/184 X
5,039,964  8/1991  Ikeda ............................ 333/181
5,126,707  6/1992  Ikeda ............................ 333/185

FOREIGN PATENT DOCUMENTS 3628021   2/1988  Fed. Rep. of Germany.
58-096717 6/1983  Japan.

Primary Examiner—Robert J. Pascal
Assistant Examiner—Ali Neyzari
Attorney, Agent, or Firm—Oliff & Berridge

[57] ABSTRACT

A laminated LC element comprises a laminate including a plurality of bonded insulating layers, a first conductor including conductive elements which continuously extend around the insulating layers so as to form a coil having a predetermined number of turns; and a second conductor including second conductive elements which extend around the insulating layers, facing the first conductor via said insulating layers, and producing a capacitance with the first conductor. The LC element can eliminate firmly noises from external sources.

35 Claims, 19 Drawing Sheets

FIG. 22a
PRIOR ART
FIG. 22b
PRIOR ART
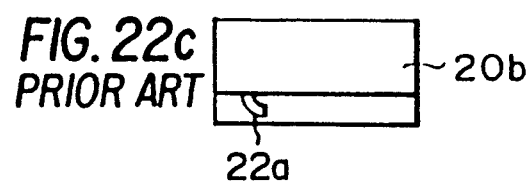
FIG. 22c
PRIOR ART
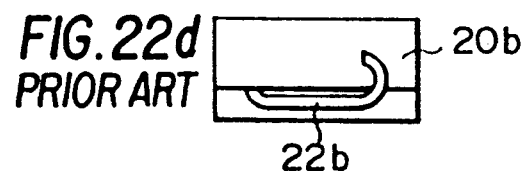
FIG. 22d
PRIOR ART
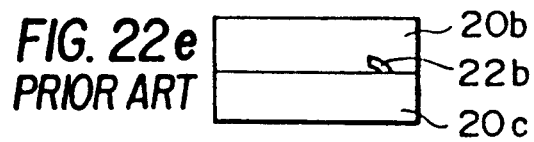
FIG. 22e
PRIOR ART
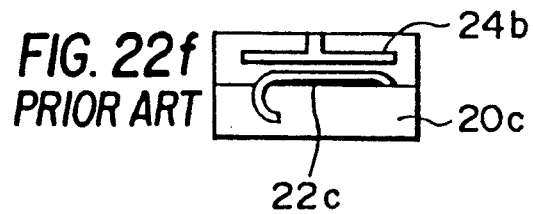
FIG. 22f
PRIOR ART
FIG. 23
PRIOR ART
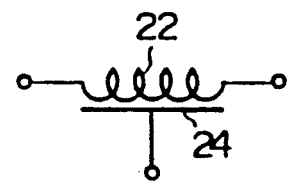

LAMINATED LC ELEMENT AND METHOD FOR MANUFACTURING THE SAME

This is a continuation of application Ser. No. 07/630,234, filed Dec. 19, 1990, now U.S. Pat. No. 5,126,707.

BACKGROUND OF THE INVENTION

1. Field of the Invention

This invention relates to a laminated LC element, and particularly to a distributed constant type laminated LC element for making up a distributed constant circuit for an LC which includes inductance conductors and capacitor conductors in a laminate having a number of insulating layers.

2. Description of the Related Art

Along with the recent development of the electronics technology, electronic circuits have been widely applied to a variety of fields. It has been strongly demanded that those electronic circuits function stably and properly without being affected by external noises.

In addition, various sophisticated electronic devices have been widely used at present, and the demand for strict noise reduction has increased accordingly. So as to satisfy such demand, it has been desired to develop noise filters which can eliminate the noises sufficiently, and are compact and have a high quality.

As shown in FIG. 21 of the accompanying drawings, a conventional LC noise filter comprises a pair of windings 12, 14 wound around a core 10, and capacitors 16, 18 connected in parallel to both ends of the windings 12, 14.

The core 10 and windings 12, 14 composing an inductor are bulky, and the inductor and capacitor 16, 18 are separate members. Therefore the filter becomes large and cannot satisfy the demand for compact size and light weight.

Various proposals have been made to cope with the above-mentioned problems as disclosed in Japanese Patent Laid-Open Publications 50507/1981, 144524/1981, 142622/1981, and 76313/1988.

For example, Japanese Patent Laid-Open Publication No. 50507/1981 discloses compound electronic parts, in which a laminate is composed by disposing a plurality of insulating layers 20a, 20b, 20c, . . . as shown in FIGS. 22(a) to 22(f). In addition, conductor patterns 22a, 22b, 22c are disposed around the insulating layers 20a, 20b, . . . so as to compose a coil having the predetermined number of turns.

Conductive layers 24a, 24b are disposed between the insulating layers 20a, 20b, 20c, . . . apart from the conductor patterns 22a, 22b, thereby providing a capacitance C between the conductive layers 24a, 24b and the conductor patterns 22a, 22b. Thus a concentrated constant type noise filter having L and C is obtained as shown in FIG. 23.

The LC noise filter of the conventional example is compact in size and light weight since L and C are built in the layers. However this filter has some inconveniences in the following: (1) the conductive layers 24a, 24b providing a capacitance are simply disposed adjacent to the straight portion of the conductor patterns 22a, 22c serving as a coil. Therefore the capacitance C between the coil and the conductive layers 24 is too small to offer a good attenuation. In addition, since the LC filter of FIG. 23 is of the concentrated constant type, it cannot sufficiently remove various noises, particularly common mode noises such as switching surge, and normal mode noises such as ripples. (2) Further, the LC filter can be used as a 3-terminal type normal mode filter but not as a 4-terminal type common mode filter.

SUMMARY OF THE INVENTION

It is therefore an object of this invention to provide a compact laminated LC element which can eliminate noises sufficiently.

A further object of this invention is to provide a laminated LC element which is applicable not only as a normal mode noise filter but also as a common mode noise filter.

According to the invention, a laminated LC element comprises: a laminate including a plurality of bonded insulating layers; a first conductor including conductive elements which continuously extend around said insulating layers so as to form a coil having the predetermined number of turns; and a second conductor including second conductive elements which extend around said insulating layers, the second conductor facing said first conductor via said insulating layers to provide a capacitance with said first conductor.

Functions of the LC element of this invention will be described hereinafter.

The laminated LC element comprises a laminate made of plurality of bonded insulating layers.

A first conductor comprises a first conductive element which extends around one insulating layer to another insulating layer, and serves as a coil having the predetermined inductance.

A second conductor comprises a second conductive element which extends around one insulating layer to another insulating layer.

The LC element features that the first conductive element faces the second conductive element via the insulating layer disposed between them, so that a capacitance is provided between the first and second conductive elements.

In this case, it is assumed that the second conductor produces a distributed constant type capacitance in the space with the first conductor. Therefore, the laminated LC element of the invention functions as a distributed constant type LC filter, can assure more excellent attenuation in a relatively wide band than conventional concentrated constant type LC filters, and can eliminate various noises without causing any ringing. To be more specific, with the laminated LC element, the L element and C element function effectively in the distributed constant circuit so as to eliminate various noises.

In addition, the LC element includes a grounding terminal connected to the second conductor, and input/output terminals at both ends of the first conductor, thereby functioning as a normal mode type LC noise filter.

The LC element also has input/output terminals at both ends of the first and second conductors so as to serve as a common mode type LC noise filter.

BRIEF DESCRIPTION OF THE DRAWINGS

FIGS. 22(a) to 22(f) show an example of the process for producing the conventional laminated LC element;

FIG. 23 is a diagram showing an equivalent circuit composed of the LC element of FIGS. 22(a) to 22(f)

DETAILED DESCRIPTION

Preferred embodiments of the invention will be described with reference to the accompanying drawings.

FIRST EMBODIMENT

Figure 1:
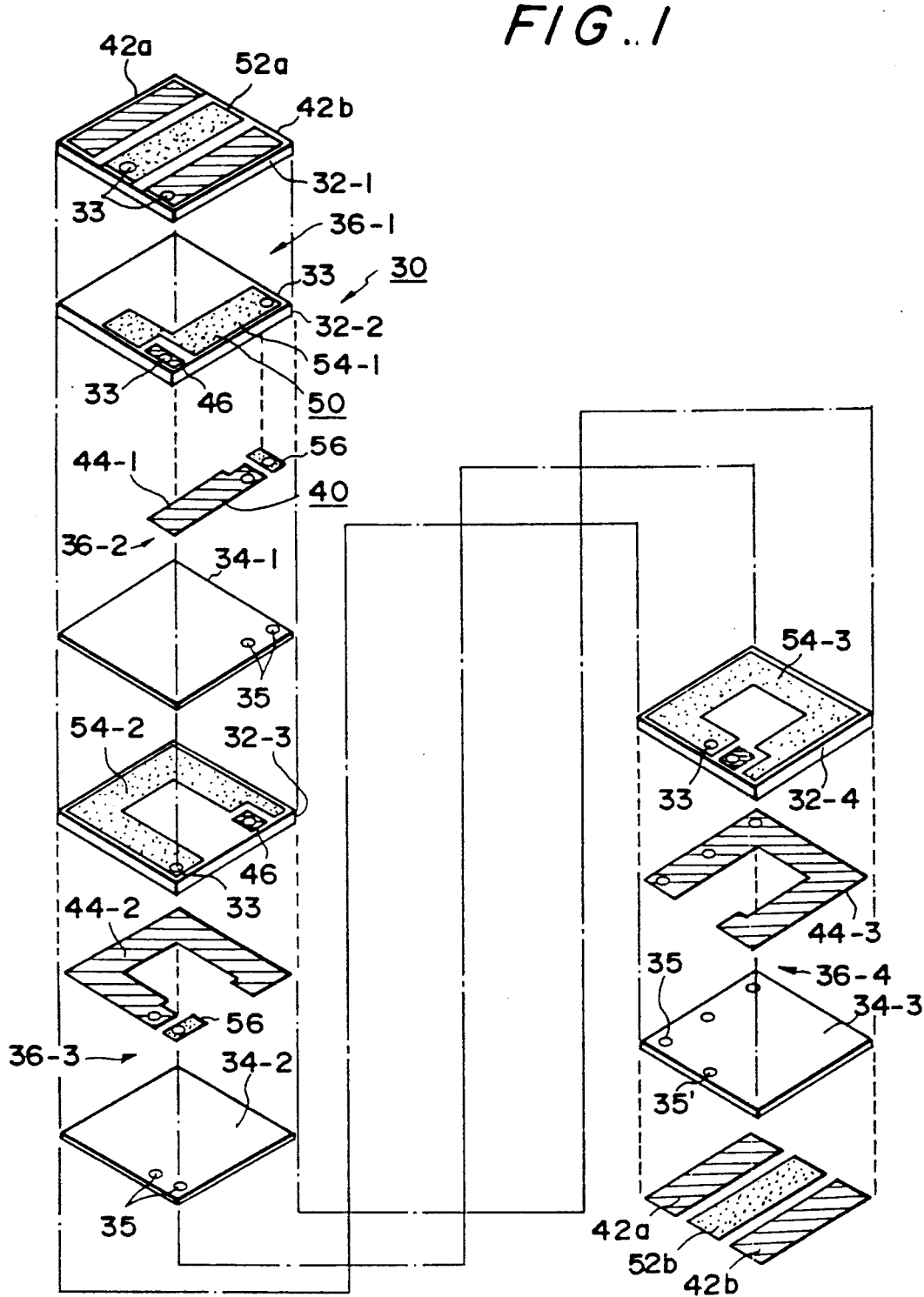
FIG. 1 is a perspective view of a laminated type LC element, in disassembled form, according to a first embodiment of the invention.
Figure 2:
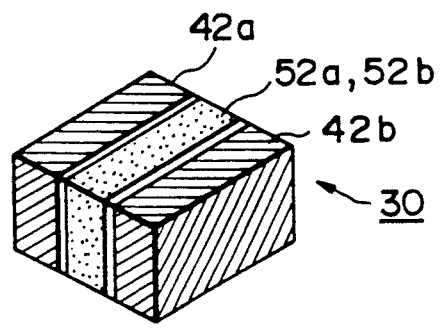
FIG. 2 is a front and top-right perspective view of the assembled LC element of FIG. 1.

FIGS. 1 to 3 show a first preferred embodiment of the invention. In this embodiment, an LC element comprises a laminate 30 including a plurality of bonded insulating plates 32-1, 32-2, ... 32-4, a first conductor 40 disposed in spaces 36-2, 36-3, 36-4 between the bonded insulating plates 32 and serving as a coil having the predetermined turns, and a second conductor 50 disposed in spaces 36-1, 36-2, 36-3 between the insulating plates 32. The second conductor 50 faces the first conductor 40 via the insulating plates 32.

The insulating plates may comprise any insulating materials according to the needs. Ceramics, plastics and various synthetic resins are conceivable as the insulating materials, for example. In this embodiment, the insulating plates are ceramics.

With the laminate 30 of this embodiment, the respective insulating plates 32 are bonded with insulating sheets 34-1, 34-2 and 34-3 interposed so as to prevent short-circuiting of the first and second conductors 40 and 50, respectively.

On the surface of the uppermost insulating plate 32-1 are disposed terminals 42a, 42b for the first conductor 40, and the surface of the lowermost insulating plate 34-3 are disposed terminals 52a, 52b for the second conductor 50.

The first conductor 40 comprises a plurality of first conductive elements 44-1, 44-2, 44-3 which are disposed in spaces 36-1, 36-2, ..., 36-4 between the insulating plates 32, while the second conductor 50 comprises a plurality of second conductive elements 54-1, 54-2, 54-3 which are disposed similarly to the first conductive elements.

It is a feature of this embodiment that the first and second conductive elements 44 and 54 face one another via the insulating plates 32 and produce a capacitance substantially continuously.

Therefore both the first and second conductors 40, 50 function as coils having the specified number of turns, and substantially continuously produce the capacitance C between them through the insulating plates 32. The capacitance C is assumed to be produced as the distributed constant between the first and the second conductors 40, 50.

The first and second conductive elements 44 and 54 are produced by such a process as printing, evaporating or plating so that these elements 44, 54 face both sides of the insulating plates 32. In addition, connecting conductive patterns 46, 56 are prepared on both surfaces of the insulating plates 32.

The terminal 52a on the insulating plate 32-1 is connected to the second conductive element 54-1 via a through hole 33. Similarly the terminal 52b on the lowermost insulating plate 34-3 is connected to the second conductive element 54-3 via through holes 35-1, 33 on an insulating sheet 34-3 and an insulating plate 32-4.

The input terminal 42-b on the insulating plate 32-1 is connected to an end of the first conductive element 44-1 on the rear side of the insulating plate 32-2 via the through holes 33 on the insulating plates 32-1, 32-2 and the conductive pattern 46. The input/output terminal 42a on the lowermost insulating sheet 34-3 is connected to the first conductive element 44-3 on the insulating plate 32-4 via the through hole 35.

The first and second conductive elements 44, 54 disposed on the insulating plates 32-2, 32-3, 32-4 are electrically connected in the spaces 36 between the insulating plates 32 via the through holes 33, the conductive patterns 46, 56, and the through holes 35 on the insulating sheets 34.

Both ends of the first conductor 40 are connected to the terminals 42a, 42b so as to serve as a coil having the specified inductance $L_1$. Similarly the second conductor 50 has its both ends connected to the terminals 52a, 52b, thereby functioning as a coil having the specified inductance $L_2$.

In addition, it is assumed that the capacitance C is produced as the distributed constant between the first and second conductors 40, 50.

The laminated LC element according to this invention can show excellent features which are not offered by conventional concentrated constant type LC elements. When it is used as an LC noise filter, the LC element can offer a good attenuation for a wide band.

According to the invention, the first and second conductors 40, 50 face each other via the insulating plates 32, so that a sufficiently large capacitance can be obtained compared with conventional laminated type LC elements. From this, it will be apparent that the LC element is applicable to an LC noise filter with the excellent attenuation.

Figure 4:
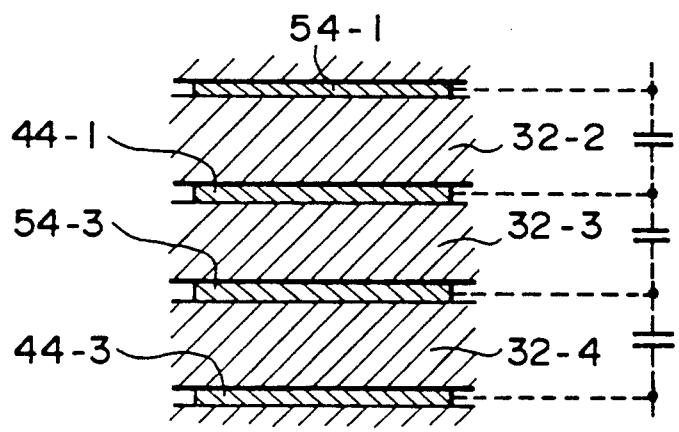
FIG. 4 shows a vertical arrangement of respective conductive elements.

The conductive elements 44, 54 are vertically arranged as shown in FIG. 4. For example, the conductive element 44-1 not only faces the second conductive element 54-1 via the insulating plate 32-2 so as to produce the capacitance but also faces the second conductive element 54-3 via the insulating plate existing underside so as to produce another capacitance. In other words, the conductive elements 44 produce the capacitances with the second conductive elements 54 disposed at the upper and lower sides. The laminated LC element can produce sufficiently large capacitances in a limited spaces between the first and second conductors. It will be clear that the LC element has very excellent characteristics.

Figure 5:
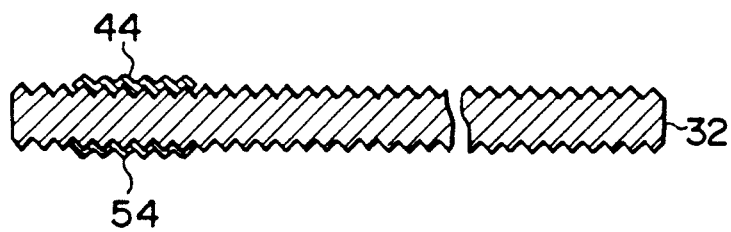
FIG. 5 shows that conductive elements are disposed on roughened surfaces of a substrate so as to increase the effective area of the elements.

It is preferable to roughen the surface of the insulating plates 32 by etching, for example, so as to increase the capacitance C of the LC element, as illustrated in FIG. 5. When they are disposed on the insulating plates 32 having the roughened surface, the conductive elements 44 and 54 face each other in a wide area. Thus the LC element having the same size can produce a further increased capacitance C.

According to the invention, the LC element can produce the capacitance C in the distributed constant form. In addition, the capacitance can be increased without enlarging the element itself, if necessary. These features distinguish the LC element of this invention from the conventional laminated LC elements.

When the LC element of this invention is applied to a noise filter, it can attenuate noises in a wide band, and can eliminate the noises more efficiently than conventional concentrated constant type LC elements.

The laminated LC element of this invention is applicable to both a normal mode LC noise filter and a common mode LC noise filter.

Figure 3A:
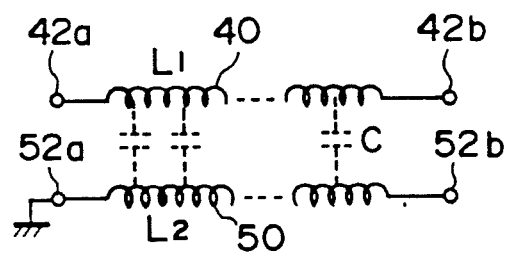
FIGS. 3(a) and 3(b) are diagrams of equivalent circuits.

As shown in FIG. 3(a), the laminated LC element can be used as a normal mode LC noise filter having the distributed constant type L and C, when either of the terminals 52a, 52b is grounded.

Figure 3B:
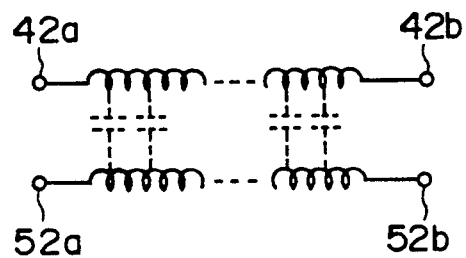

As illustrated in FIG. 3(b), the laminated LC element can be used as a 4-terminal common mode LC noise filter having the capacitance produced between the conductors as the distributed constant, when the terminals 52a, 52b connected to the ends of the second conductor 50 are not grounded.

FIG. 2 shows an example in which the laminated LC element is used as a 3-terminal normal mode noise filter.

In this case, the laminate 30 comprises the insulating plates 32 and the insulating sheets 34 which are bonded together. The input terminals 42a and 42b on the front and rear surfaces of the laminate 30 are connected and are coated with a conductive material, so that these input terminals function as one terminal. The terminals 52a and 52b are similarly coated with the conductive material. (In the foregoing embodiment, one of terminals of the second conductor 50 is grounded while the other terminal 52b and the end of the second conductor 50 are insulated. Therefore, at least one of the through holes 33, 35 of the insulating plate 32-4 and the insulating sheet 34-3 is removed.)

The LC element functions as a 3-terminal noise filter which comprises the laminate 30 having on its surface two input/output terminals 42a and 42b, and one grounding terminal 52. In addition, since the noise filter is an SMD type (surface mount device), it is very easy to handle.

Figure 6:
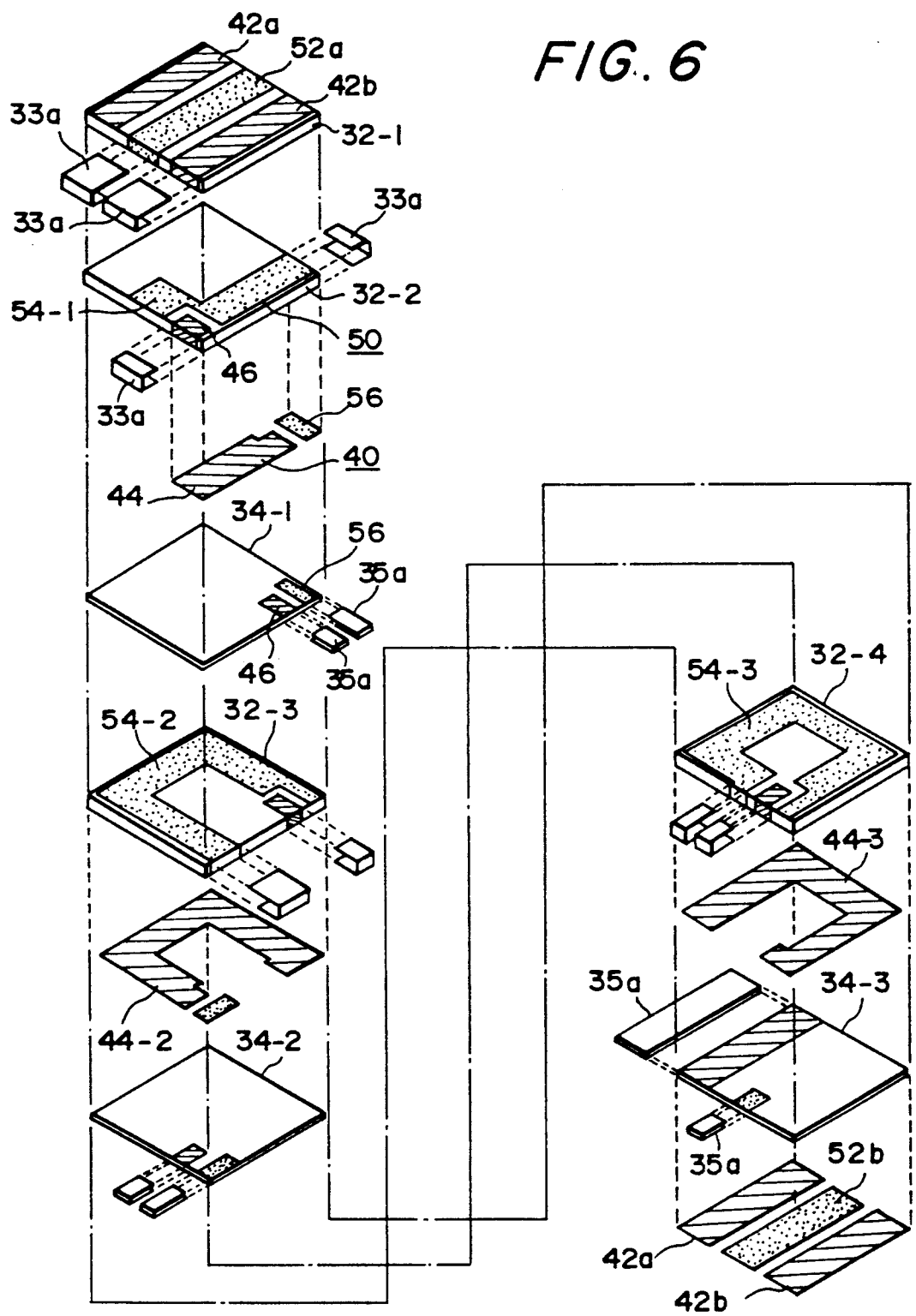
FIG. 6 is a perspective view of a modified LC element, in disassembled form.

With the foregoing embodiment, the respective circuits are connected via the through holes 33 and 35, for example. However this invention is not limited to the above arrangement, but the circuits can be connected via conductive caps 33a and 35a shown in FIG. 6 in place of the through holes 33 and 35. Further conductive patterns prepared by conductive plating or printing, or applying conductive patterns may also be used for this purpose. In addition, the through holes 33, 35, conductive caps 33a, 35a, and conductive patterns made by the plating can be combined as desired.

When the conductive caps 33a, 35a are employed, it is preferable that the insulating plates 32 and the insulating sheets 34 be coated with conductive patterns 46, 56 at the positions for disposing the conductive caps, so that a contact resistance can be reduced.

Figure 7:
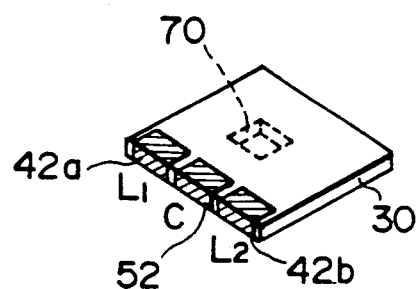
FIG. 7 shows a modified arrangement of terminals of an SMD type laminated LC element.
Figure 8:
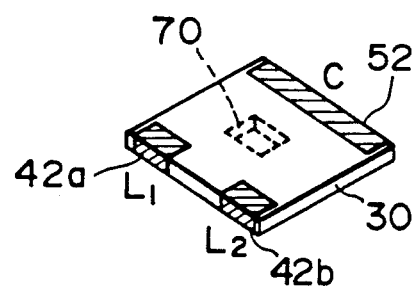
FIG. 8 shows a further modified arrangement of terminals of another SMD type laminated LC element.
Figure 9A:
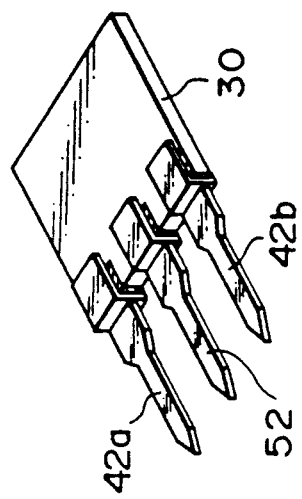
FIGS. 9(a) to 9(d) show examples of laminated LC terminals formed as discrete types.
Figure 9B:
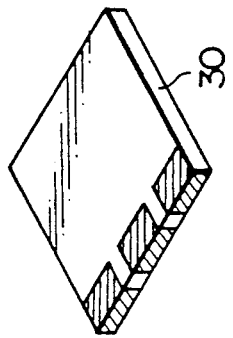
Figure 9C:
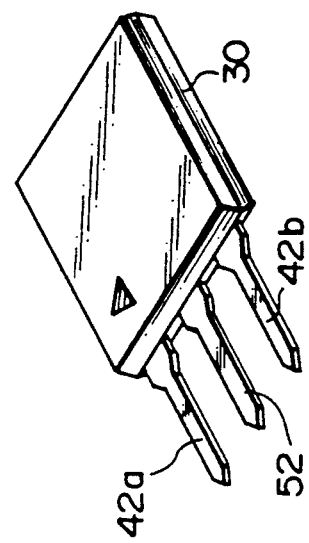
Figure 9D:
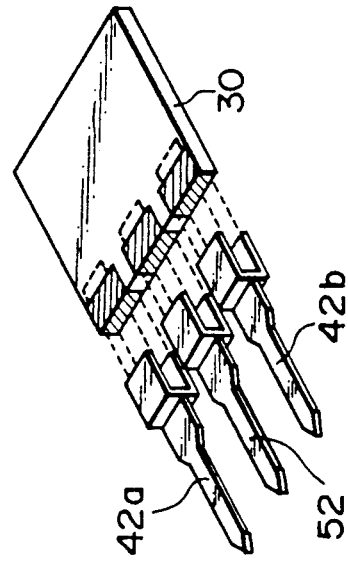

In the foregoing embodiment, the terminals 42a, 42b and 52 are disposed so as to coat the whole surface of the laminate 30 as illustrated in FIG. 2. The terminal pattern can be formed as desired. For example, the terminals 42a, 42b and 52 may be disposed so as to coat one side of the laminate 30 as shown in FIG. 7. In addition, the terminals 42a, 42b may be coated on one side while the grounding terminal 52 may be coated on the other side of the laminate 30, as shown in FIG. 8.

Although it is exemplified as the SMD type element in the foregoing description, the laminated LC element may be formed as a discrete type element in which the terminals 42a, 42b and 52 are formed as pin-shaped terminals as illustrated in FIGS. 9. FIGS. 9(a) to 9(d) show the procedure to dispose the pin-shaped terminals 42a, 42b and 52.

In the foregoing embodiment, since the first and second conductive elements 44 and 54 are disposed to coat both sides of the insulating plates 32, it is necessary to dispose the insulating sheets 34 in the spaces 36-2, 36-3 , . . . between the insulating plates 32. However when the first and second conductive elements are disposed on a side of the insulating plates 32, the laminate 30 can be made without using the insulating sheets 34.

Figure 10:
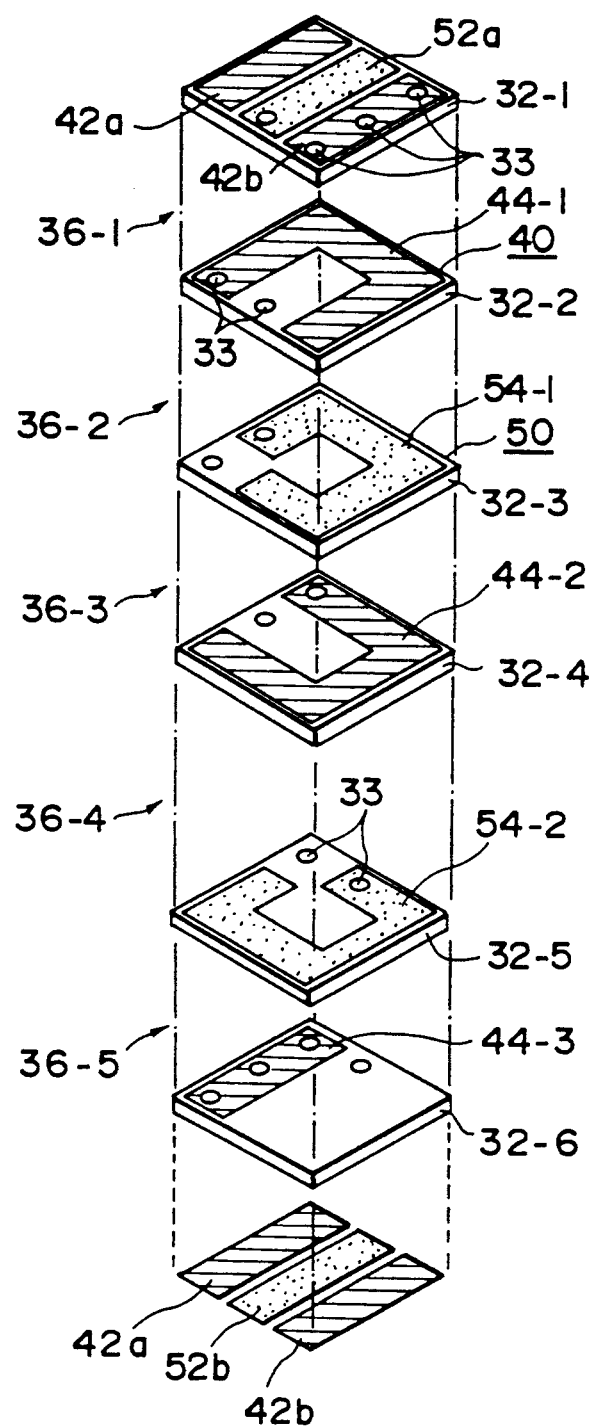
FIG. 10 is a perspective view, in disassembled form, of a further LC element including one kind of conductive elements coated on an insulating plate.

For example, the first conductive elements 44-1, 44-2, 44-3 are coated on the insulating plates 32-2, 32-4, 32-6 as shown in FIG. 10, and the second conductive elements 54-1, 54-2 are coated on the insulating plates 32-3, 32-5. By these arrangements, the conductive elements 44 and 54 are completely insulated from one another via the insulating plates 32, so that the laminate 30 can be composed without insulating sheets.

Especially in this case, the conductive patterns of the first conductive elements 44 can be formed identically, and those of the second conductive elements 54-1, 54-2 can be made the same. Therefore, when a plurality of the insulating plates having the conductive elements 44, 54 of the same patterns are available, an LC element can be prepared by bonding the insulating plates 32 by changing their directions. This enables use of common parts and cost reduction.

With the example shown in FIG. 10, either the first conductive elements 44 or the second conductive elements 54 are coated on the surface of one insulating plate 32. However, it is possible to coat both the first and second conductive elements 44, 54 on the same insulating plates 32, as illustrated in FIG. 11.

Figure 12:
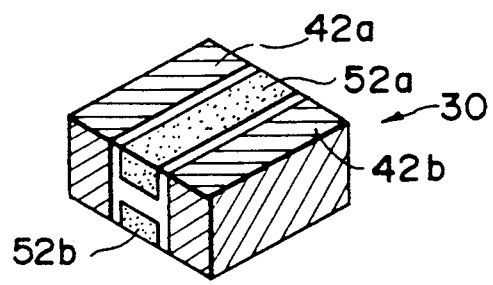
FIG. 12 is a perspective view of the laminated LC element of FIG. 11 in assembled form.

In such a case, the insulating plates 32-1, 32-2, . . . 32-5 can be bonded so as to compose a laminate 30 as illustrated in FIG. 12. Thus, the second conductive element 54-1, for example, faces the first conductive elements 44-1, 44-3 via the insulating plates 32-2 and 32-3, thereby causing a capacitance to be produced between the conductive elements.

The above arrangement obviates the insulating sheets as in the arrangement shown in FIG. 10. In addition, use of the laminate 30 having the conductive elements 44, 54 of the same pattern enables the LC elements to be made from common parts and allows the cost reduction.

Figure 11:
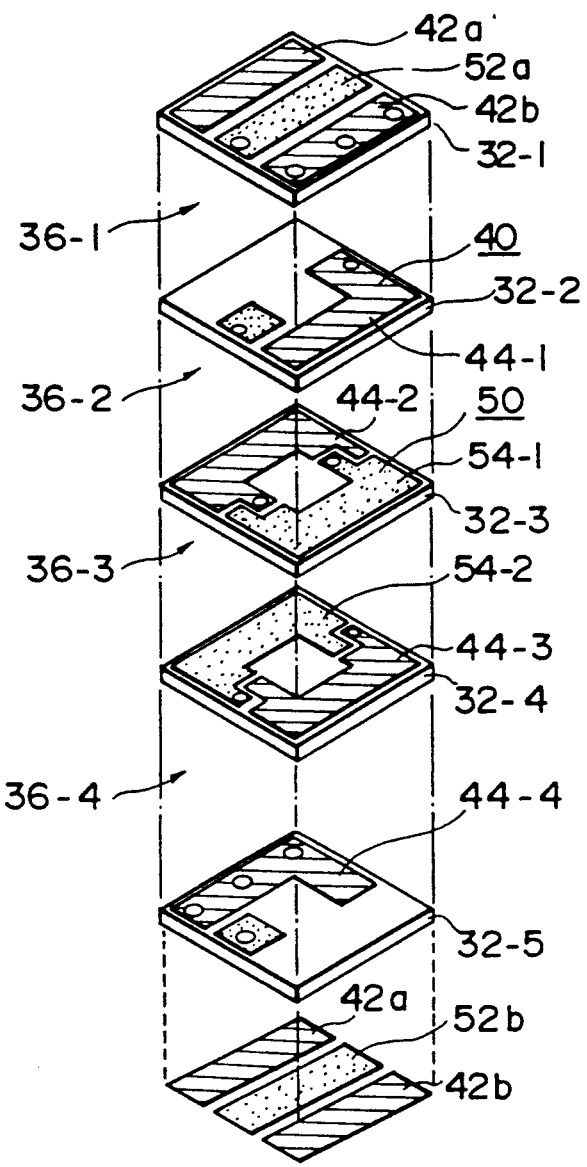
FIG. 11 is a perspective view, in disassembled form, of a still further LC element including two kinds of conductive elements coated on the same surface of an insulating plate.

The conductive patterns of this invention are not limited to the examples shown in FIGS. 1, 10 and 11. For instance, when it is necessary to increase the inductance and capacitance of the first and second conductors 40, 50 in the laminate 30, the first conductive elements 44 are coated on the front surfaces of the insulating plates 32-1, 32-2, 32-3, 32-4, and are electrically connected between the insulating plates via through holes (not shown).

The second conductive elements 54 (not shown) are coated on the rear sides of the insulating plates 32-1, 32-2, 32-3, 32-4 so as to face the first conductive elements 44. Then, the second conductive elements 54 are mutually and electrically connected between the insulating plates via the through holes (not shown).

The number of coil turns of the first and second conductors 40, 50 in the laminate 30 is increased, so that a laminated LC element having a large inductance L and capacitance C can be formed.

The first and second conductors 40, 50 are formed in desired patterns. The patterns of FIG. 13 can be replaced with those shown in FIGS. 14 and 15.

Figure 13:
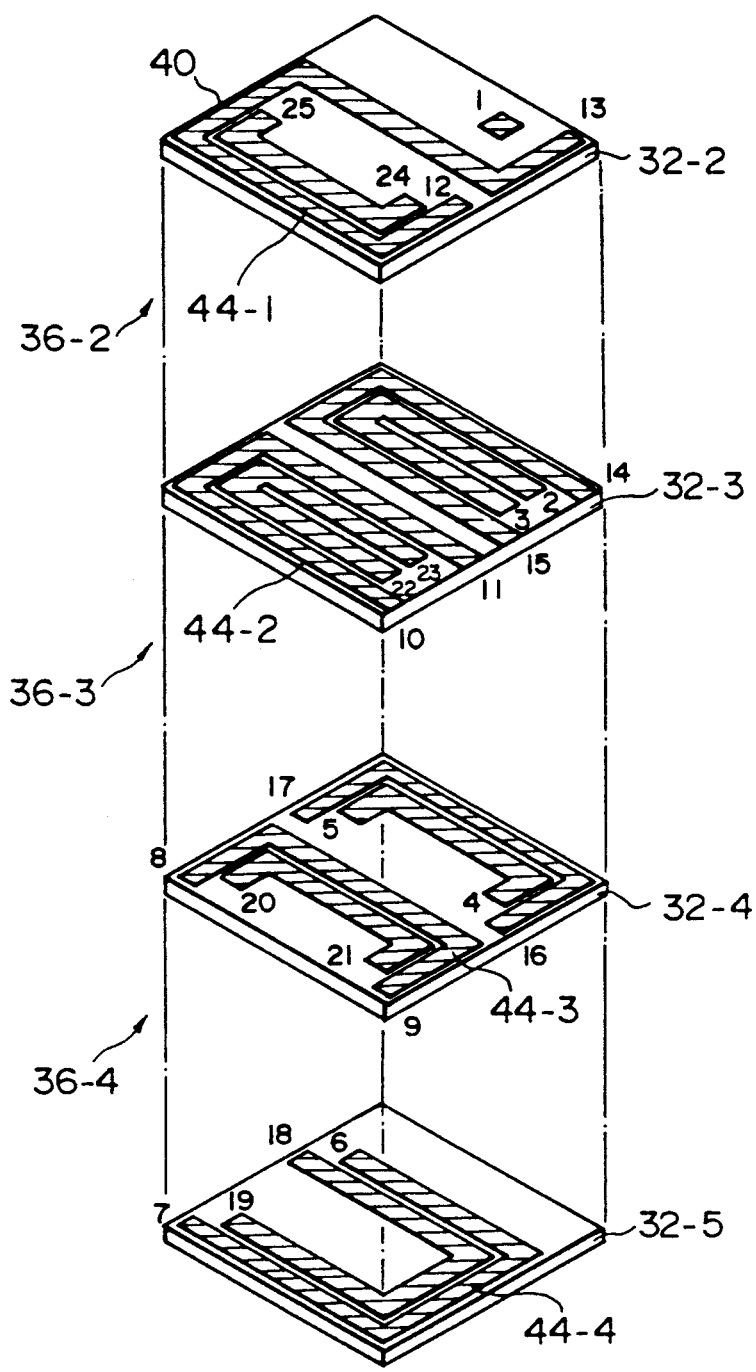
FIG. 13 shows an LC element comprising a plurality of insulating plates having coated conductive element patterns.
Figure 14:
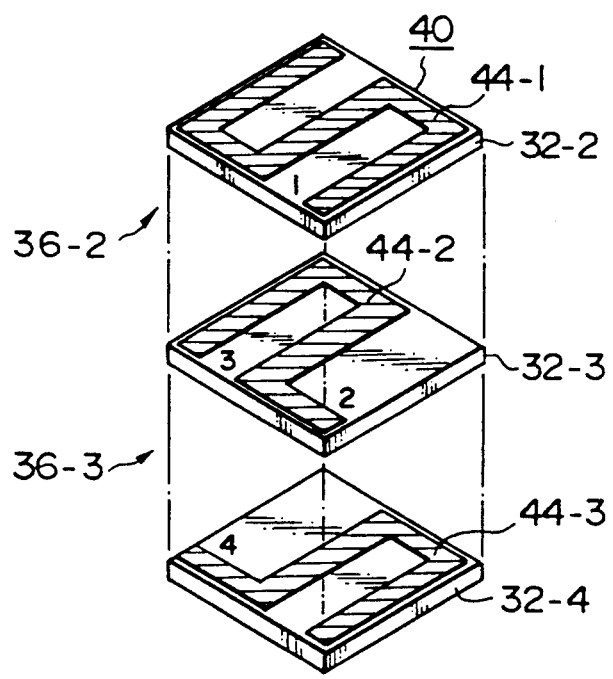
FIG. 14 shows another LC element comprising a plurality of insulating plates having coated conductive element patterns.
Figure 15:
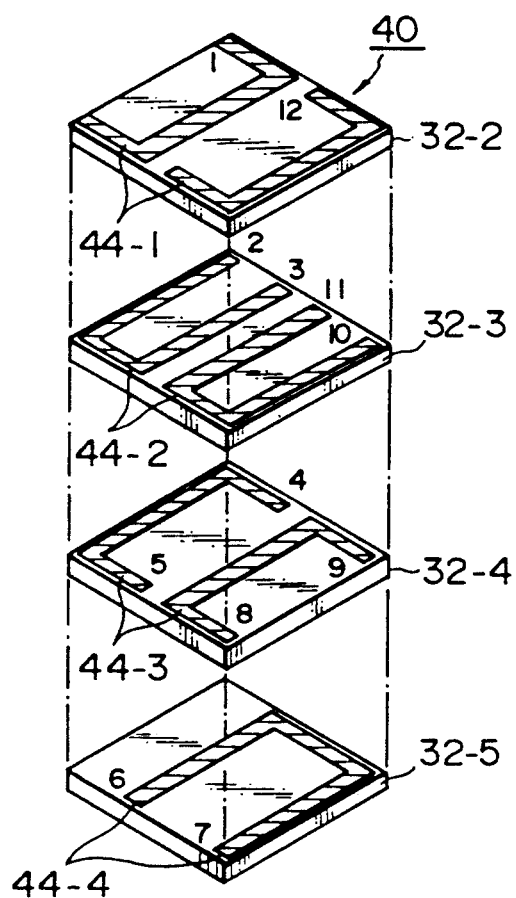
FIG. 15 shows a further LC element including a plurality of insulating plates having coated conductive element patterns.

In the examples of FIGS. 13 to 15, the respective conductive elements are mutually connected according to the reference numerals given at their ends.

In the foregoing embodiment, the insulating plates are of ceramics, which are made by burning green sheets. Firstly green sheets which are made of dielectric materials, sintering accelerators, binders and so forth and are very flexible, are prepared. Two kinds of green sheets are prepared for the insulating plates 32 and for the insulating sheets 34. The conductive pattern as shown in FIG. 1, for example, is printed on the green sheets. Then the through holes are made on the green sheets at the desired positions. The green sheets are then piled according to the order shown in FIG. 1. A plurality of green sheets without printed internal electrodes are piled on the outermost sides of the above-mentioned green sheets so as to assure insulation and reinforcement. The piled green sheets are integrally molded under the constant temperature, humidity and pressure. When the green sheets become monolithic, they are cut into pieces as raw chips. These raw chips are burnt at the predetermined temperature. The surfaces of the burnt chips where terminals are exposed are applied conductive patterns as shown in FIG. 2, and are then burnt at a high temperature. Thus the laminated LC element according to the invention can be manufactured by the method for manufacturing laminated ceramics chip condensers.

SECOND EMBODIMENT

A second preferred embodiment of this invention will be described hereinafter.

With the first embodiment, the insulating plates are used as insulating layers, while this embodiment employs insulating thin or thick films as the insulating layers.

The laminated LC elements can be manufactured according to film making methods as shown in FIGS. 16(a) to 16(m).

Figure 16:
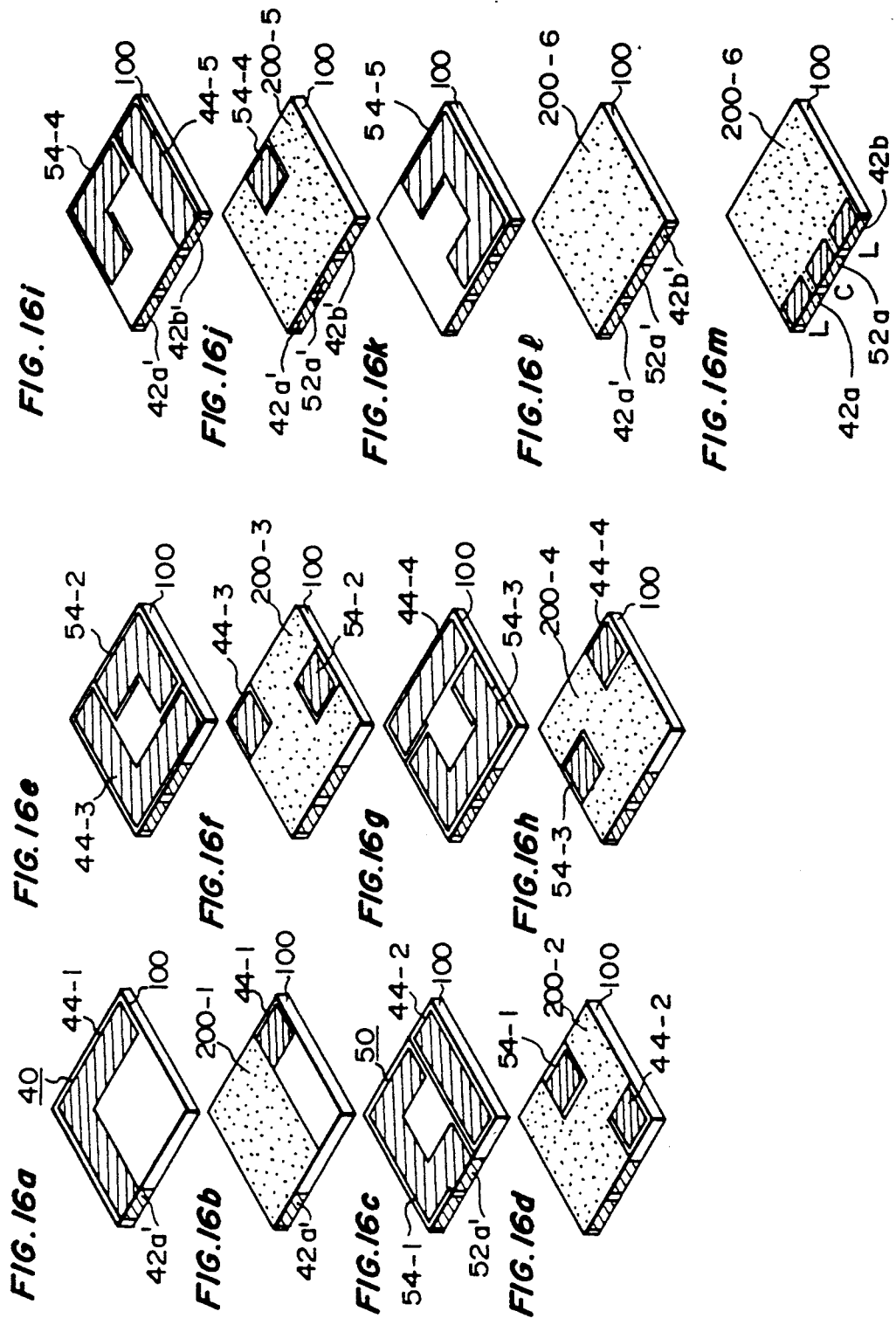
FIGS. 16(a) to 16(m) show a process, according to a second embodiment, for producing a laminated LC element by using conductive elements and insulating films which are formed on a substrate by means of a thin film manufacturing technique.

As shown in FIG. 16(a), an auxiliary terminal portion 42a' is coated on the rear surface to the side surface of an insulating substrate 100. A substantially L-shaped first conductive element 44-1 which extends from the terminal portion 42a' is coated on the surface of the substrate 100.

Next, an insulating thin film 200-1 is coated on the surface of the substrate 100 so that an end of the conductive element 44 is exposed, as shown in FIG. 16(b).

The first conductive element 44-2 electrically connected to the first conductive element 44-1 is coated on the substrate 100 as shown in FIG. 16(c). At the same time, the auxiliary terminal 52a' is coated on the rear surface to the side surface of the substrate 100. A substantially U-shaped second conductive element 54-1 whose one end extends from the terminal portion 52a' is coated on the insulating thin film 200-1, so that the second conductive element 54-1 faces the first conductive element 44-1 via the insulating thin film 200-1.

An insulating thin film 200-2 is coated on the first and second conductive elements 44-2, 54-1 with ends of these elements exposed, as shown in FIG. 16(d). Then the first and second conductive elements 44-3, 54-2 are coated on the insulating thin film 200-2 so that the conductive elements 54-1 and 44-2 face each other via the insulating thin film 200-2, as shown in FIG. 16(e).

The laminate 30 is composed by repeating the thin film forming process and the element forming process as illustrated in FIGS. 16(f) to 16(l).

During the process shown in FIG. 16(i), an auxiliary terminal portion 42b' extending from the first conductive element 44-5 is coated on the side surface and rear surface of the substrate 100.

In the final process shown in FIG. 16(m), terminals 42a, 42b, 52 which are electrically connected to the auxiliary terminal portions 42a', 42b', 52b' are coated on one side of the laminate 30.

The second embodiment described above will lead to a 3-terminal type LC element, which includes a distributed constant type equivalent circuit having L and C as illustrated in FIG. 3. When it is applied to a noise filter, the LC element can offer an excellent attenuation in a wide band.

With the second embodiment, the terminal 52a is disposed only on one side of the second conductor 2 so as to serve as a grounding terminal. This invention is not limited to such configuration, but terminals may be disposed at both ends of the second conductor 50 so as to form a 4-terminal type LC element. In this case, the terminals of the first and second conductors 40, 50 are used as input/output terminals so that the LC element is applicable as a common mode type LC noise filter having a distributed constant type capacitance between the conductors.

Figure 17:
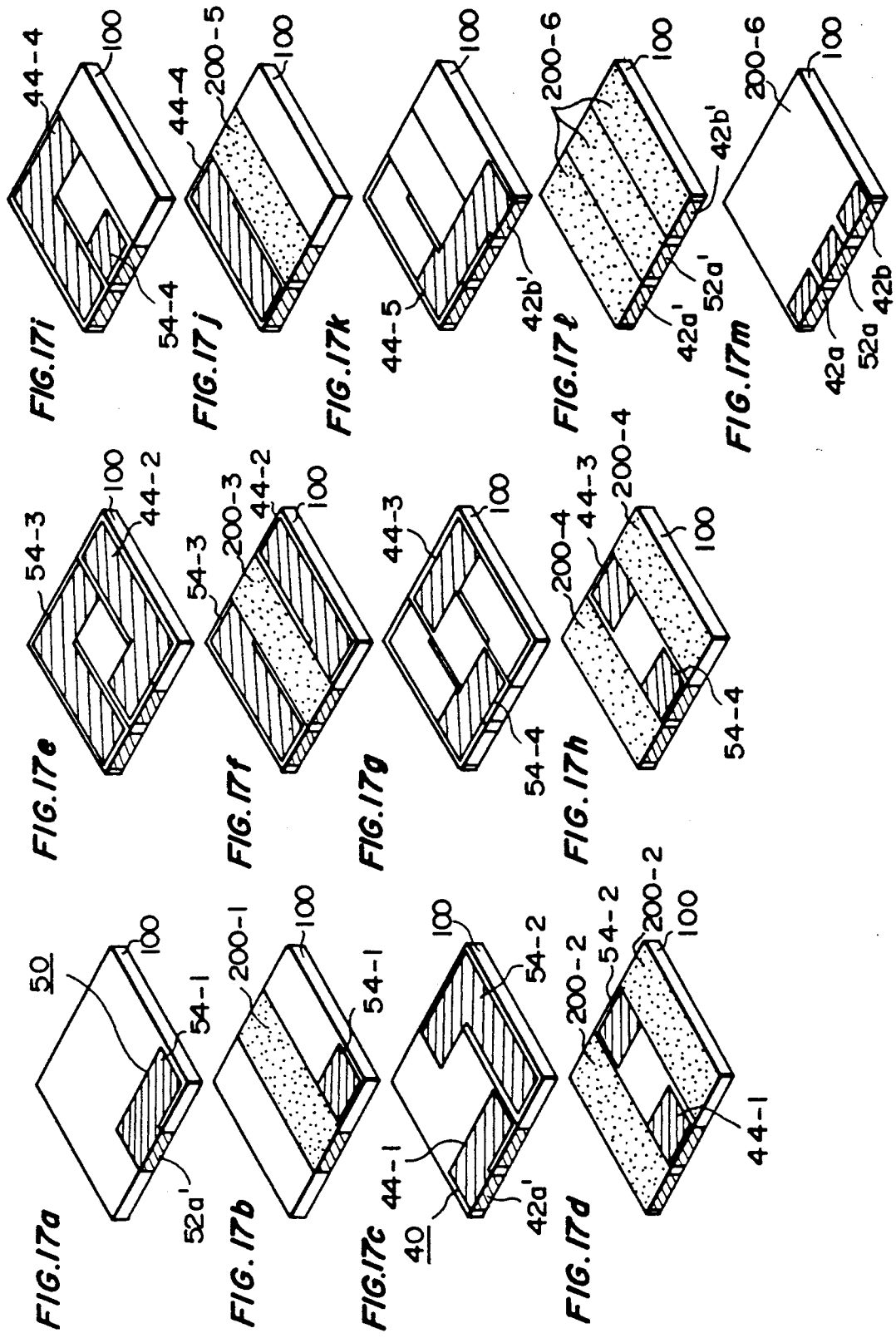
FIGS. 17(a) to 17(m) show a process for producing another laminated LC element which is similar to that shown in FIGS. 16(a) to 16(m)

The patterns of the first and second conductors and those of the insulating thin films 200 can be modified as shown in FIGS. 17. FIGS. 17(a) to 17(m) sequentially illustrate the process for manufacturing the LC element.

The laminated LC element of this embodiment can be easily produced by using various thin film manufacturing methods such as vacuum evaporation, sputtering, ion-plating, and vapor phase producing.

For instance, when producing the LC element by the sputtering method, a plurality of vacuum chambers which are separated by gates are prepared, and are filled with argon gas. In the respective chambers are disposed targets which are made of materials for the insulating thin film 200, and conductive elements 44, 54. In the chambers, the targets are disposed so as to face the substrate 100 with specific mask patterns interposed.

A negative voltage is applied to the targets via a negative electrode. The substrate 100 is connected to a grounding electrode. When a high frequency voltage is applied between the negative electrode and the grounding electrode, the targets are shocked by positively ionized gas and emit atoms or molecules, which are sputtered onto the substrate 100 and stick on it in the shape of a thin film according to the mask patterns.

The vacuum chambers are prepared to make the insulating thin films 200 on the substrate 100, and further chambers are prepared to produce the conductive elements 44, 54. The LC element according to the second embodiment can be easily produced by repeating the thin film making process and the element making process.

The laminated LC element of the second embodiment is compact in size and light in weight compared with that of the first embodiment.

THIRD EMBODIMENT

Figure 18:
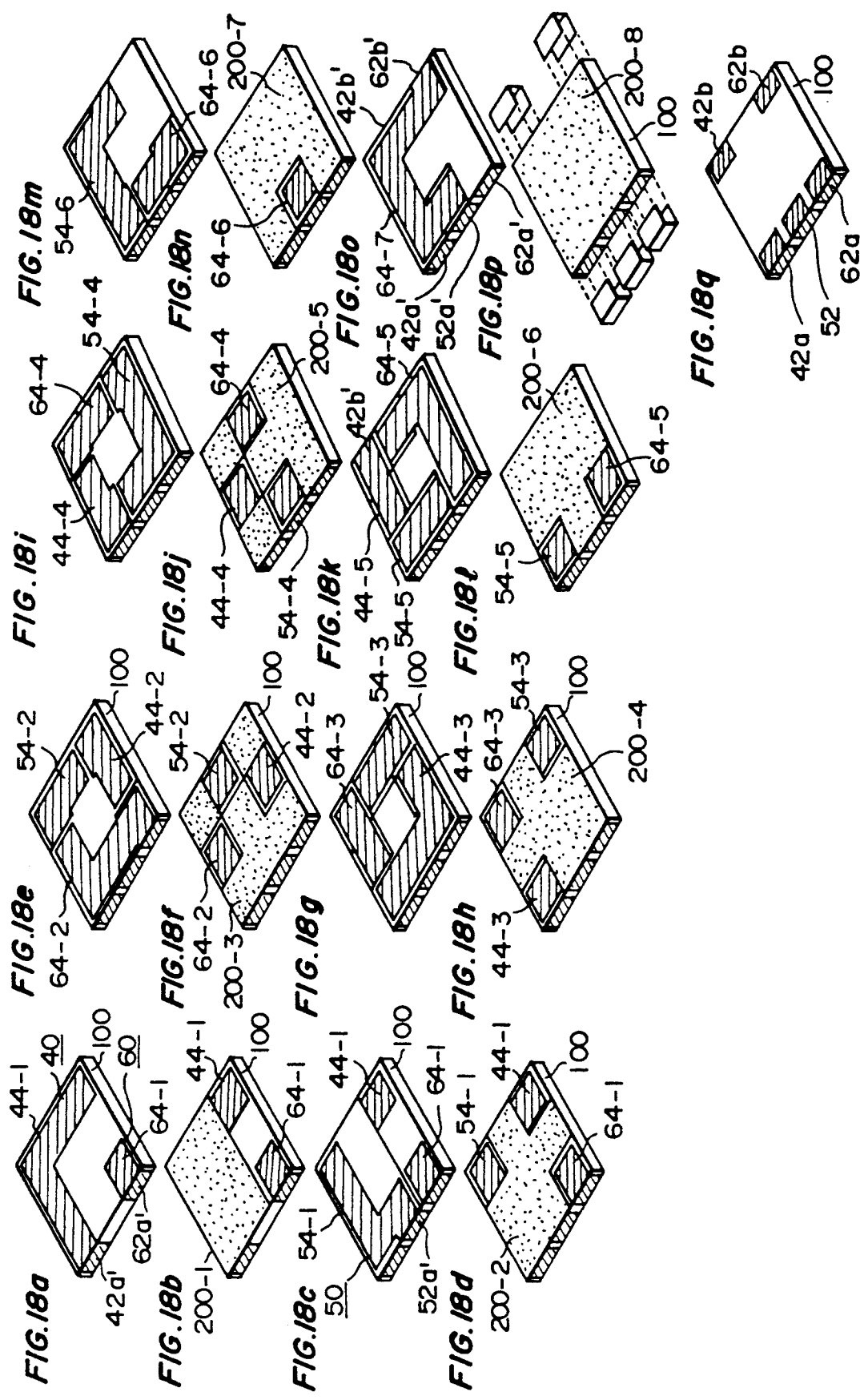
FIGS. 18(a) to 18(q) show an example of the process, according to a third embodiment, for producing a laminated LC element by using the first to third conductors.
Figure 19:
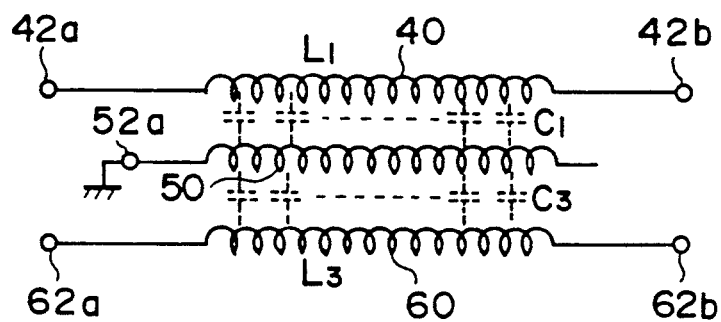
FIG. 19 is a diagram showing an equivalent circuit of the LC element of FIGS. 18(a) to 18(q)

FIGS. 18(a) to 18(q) and FIG. 19 show a third preferred embodiment of the invention.

The third embodiment features that the first and second conductors 40, 50 are interposed as thin films between the insulating thin films 200 similarly to those in the foregoing first and second embodiments, and that third conductors 60 are coated so as to face the second conductors 50 via the insulating thin films 200.

As shown in FIG. 19, the first and third conductors 40, 60 function as coils having the predetermined inductances L1 and L3. In addition, the capacitance C1 is produced as the distributed constant between the first and second conductors 40, 50, and the capacitance C3 is produced similarly between the second and third conductors 50, 60.

The terminal 52a of the second conductor 50 is grounded, and the terminals 42a, 42b, 62a, 62b of the first and third conductors 40, 60 are used as input/output terminals, so that the LC element is applicable as a common mode LC noise filter.

FIG. 18(a) to 18(q) sequentially show the process for making the common mode LC noise filter, as an example.

As shown in FIG. 18(a), the auxiliary terminal portions 42a', 62a' are coated on the rear to side surfaces of the substrate 100, and the first and third conductive elements 44-1 and 64-1 are coated on the front surface of the substrate.

Then the insulating thin film 200-1 is coated on the substrate in such a manner that ends of the first and second conductive elements 44-1, 64-1 are exposed, as shown in FIG. 18(b).

As can be seen in FIG. 18(c), the auxiliary terminal portion 52a' is coated on the rear to side surfaces of the substrate 100. In addition, the second conductive element 54-1 is coated on the substrate 100 so as to extend from the auxiliary terminal portion 52a'. The second conductive element 54-1 faces the first conductive element 44-1 via the insulating thin film 200-1.

The insulating thin film 200-2 is coated on the substrate 100 so as to expose the ends of the conductive elements 44-1, 54-1, 64-1 as shown in FIG. 18(d). Then the first, second and third conductive elements 44-2, 54-2, 64-2 are coated on the insulating thin film 200-2 as illustrated in FIG. 18(e). In this case, the second conductive element 54-2 is coated to face the first conductive element 44-1 via the insulating thin films 200-1, 200-2, while the third conductive element 64-2 is coated to face the second conductive element 54-1 via the insulating thin film 200 2.

As illustrated in FIG. 18(f), an insulating thin film 200-3 is coated so that the ends of the conductive elements 44-2, 54-2, 64-2 are exposed. Then the conductive elements 44-3, 54-3, 64-3 are coated on the insulating thin film 200-3. In this case, the first, second and third conductive elements 44-3, 54-3 and 64-3 are coated so as to face the third, first and second conductive elements 64-2, 44-2 and 54-2, respectively, via the insulating thin film 200-3.

An insulating thin film 200-4 is coated on the substrate 100 so that the ends of the conductive elements 44-3, 54-3, 64-3 are exposed, as shown in FIG. 18(f).

The foregoing thin film making process and the element making process are repeated as shown in FIGS. 18(c) to 18(o). In the final process, an insulating thin film 200-8 is coated entirely on the conductive elements 64 as illustrated in FIG. 18(p).

In the processes shown in FIGS. 18(k) and 18(o), auxiliary terminal portions 42b', 62b' connected to the ends of the conductive elements 44-7, 64-7 are coated on the side to rear surfaces of the substrate 100.

In the process shown in FIG. 18(p), conductive caps are attached to the portions of the substrate 100 where the auxiliary terminal portions 42a', 42b', 52a', 52b', 62a', 62b. Thus the terminals 42a, 42b for the first conductor 40, the terminal 52a for the second conductor, and the terminals 62a, 62b for the third conductor are formed as shown in FIG. 18(q). The conductive caps may be replaced with conductive patterns prepared by the plating, printing/burning or other methods. In addition, these patterns may be used together with the conductive caps.

As can be seen in FIG. 19, the terminal 52a of the second conductor 50 is grounded, and the terminals 42a, 42b, 62a, 62b of the first and third conductors 40, 40 are used as the input/output terminals, so that the LC element of the third embodiment is applicable as a common mode type LC filter in which the capacitance C of the distributed constant type is produced between the conductors 40, 50.

The patterns of the insulating thin films 200 and those of the conductive elements 44, 54 may be determined as desired.

The foregoing description exemplifies the LC filter, shown in FIG. 19, which is composed by the thin film making method. This invention is not limited to the embodiment described above. As with the first embodiment, the LC element can include the insulating plates 30 instead of the insulating thin films 200.

The 5-terminal type LC element of FIG. 19 is described as an example. When it is desired to obtain a large current capacity, the first and third conductors 40, 60 may be connected in parallel. In addition, it is also possible to connect the conductors 40, 60 in series so as to obtain an LC element having a large inductance compared with a capacitance.

FOURTH EMBODIMENT

In the foregoing embodiments, the conductive elements 44, 54, 64 of the first, second and third conductors 40, 50, 60 are disposed in the shape of coils having the same diameter. However this invention is not limited this, but the diameter of the coils may be changed as desired.

Figure 20:
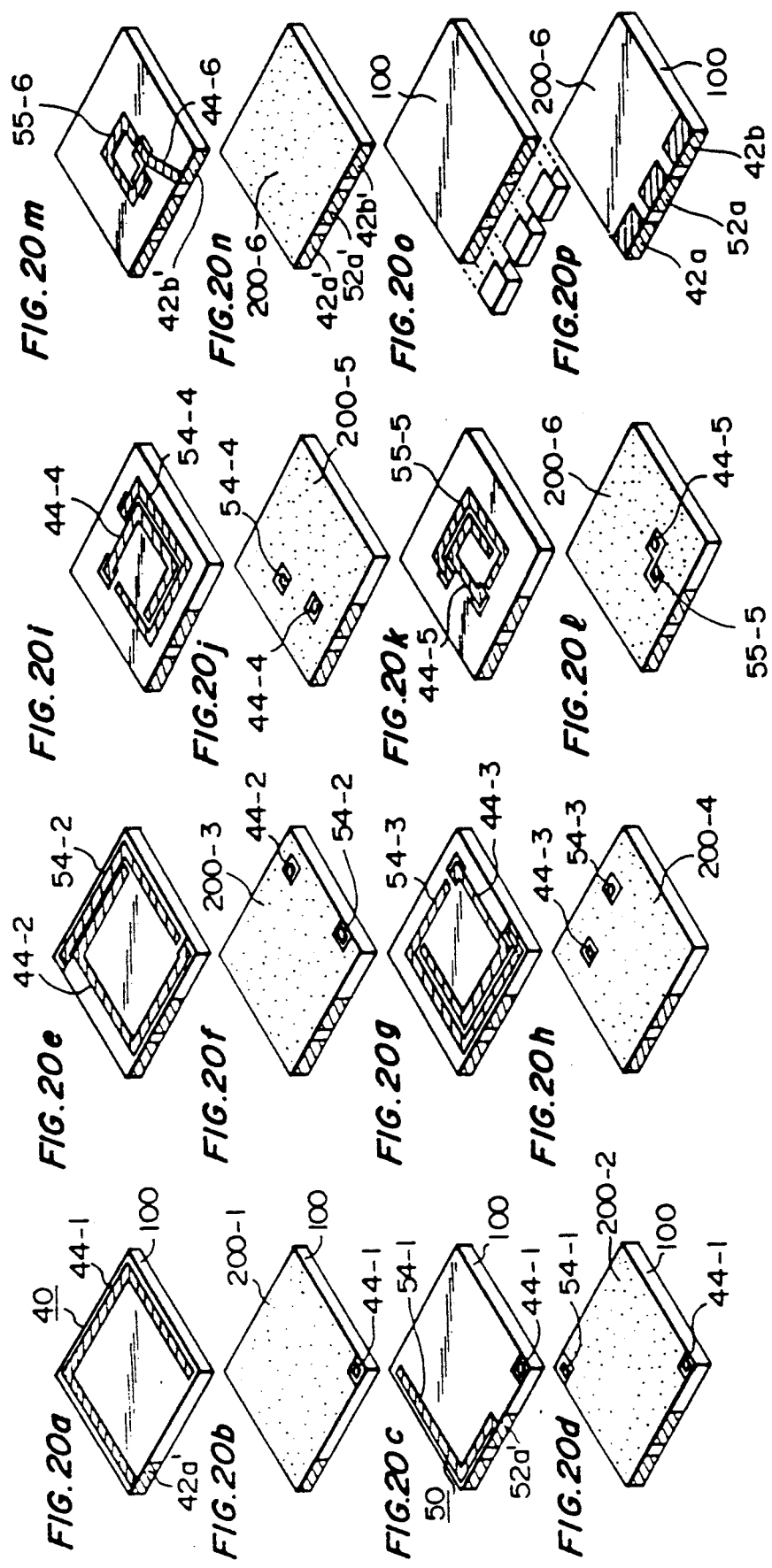
FIGS. 20(a) to 20(p) show an example of the process for producing an LC element in which coil diameters of the first and second conductors vary.
Figure 21:
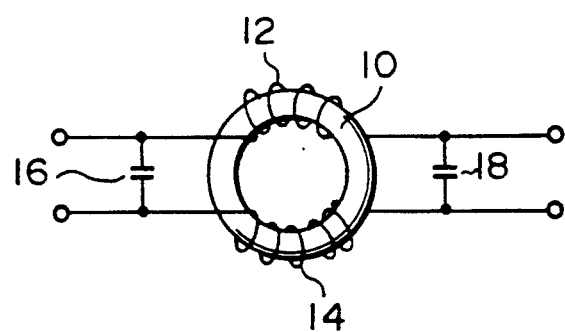
FIG. 21 shows an example of a conventional LC noise filter.

FIGS. 20(a) to 20(p) illustrate an example of the LC element which has different coil diameters. In this example, the first and second conductors 40, 50 are disposed between the insulating thin films 200-1, 200-2, 200-3, ... 200-6 so that these conductors face one another via the insulating thin films 200, thereby forming a 3-terminal normal mode type LC filter.

The first and second conductors 40, 50 extend around the insulating layers with their conductive elements 44, 54 disposed in the shape of coils whose diameters are gradually reduced.

The LC element made as described above can have resonance characteristics which differ from those of the LC elements in the first to third embodiments. In addition, the attenuation patterns of this LC element somewhat differ from those the foregoing embodiments.

On the contrary, when the first and second conductors 40, 50 are disposed in the shape of coils whose diameters are gradually increased, the inductances L of the conductors will be gradually increased, thereby enabling the LC element to be applicable as a noise filter which can eliminate noises while controlling the ringing efficiently.

In the fourth embodiment, the LC element comprises the first and second conductors 40, 50, and the insulating plates 200 which are made by the thin film making method. This embodiment is applicable to an LC element which includes the insulating plates 32 of the first embodiment in place of the insulating thin films 200.

The fourth embodiment of the invention is also applicable to an LC element which includes the first to third conductors 40, 50, 60 in place of the first and second conductors 40, 50.

In addition, the coil diameters of the first and second conductors 40, 50 are changed so as to vary the resonance point of the LC element. The foregoing embodiment is not limited to such configuration. It is also possible to vary the resonance point by changing the width (area) where the first and second conductive elements 44, 54 face one another.

FIFTH EMBODIMENT

FIGS. 24 show a fifth preferred embodiment of this invention. The members corresponding to those in the foregoing embodiments will be assigned the same reference numerals and will not be described in detail.

Figure 24A:
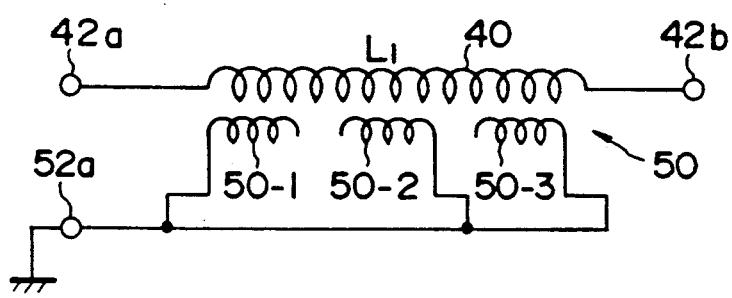
FIGS. 24(a) and 24(b) are diagrams showing equivalent circuits for a fourth embodiment of the invention.

As can be seen in FIG. 24(a), an LC element of this embodiment is composed as a normal mode type LC noise filter.

This embodiment features that the second conductor serving as a capacitor conductor is divided into a plurality of portions so as form sectional grounding conductors 50-1, 50-2, 50-3, one end each of which is connected to the grounding terminal 52a.

The LC noise filter formed thus allows the capacitance, which is produced as a distributed constant between the first and second conductors 40, 50, to be used as the capacitance of the LC filter without any adjustment, since the inductance L of the sectional grounding terminals 50-1, 50-2, 50-3 is small.

The present inventor(s) has further studied the invention, and has found that the position, where the grounding terminals 50-1, 50-2, 50-3 face the first conductor 50 serving as an inductor, greatly affects the attenuation characteristics of the noise filter. The inventor(s) has confirmed that when the sectional grounding terminals 50-1, 50-2, 50-3 are disposed at a position near the input-/output terminals of the first conductor 40, the LC element in an electric circuit can assure an excellent attenuation.

The inventor has further examined where the sectional grounding terminals 50-1, 50-2, 50-3 should be grounded. It has been confirmed that the sectional grounding terminal 50-1 disposed near the input/output terminal 42a in the electric circuit should be preferably grounded near the terminal 42a, and that the other sectional grounding terminals 50-2, 50-3 should be preferably grounded near the input/output terminal 46b in the electric circuit.

The LC noise filter of this embodiment can function as a normal mode type filter with a good attenuation.

Figure 24B:
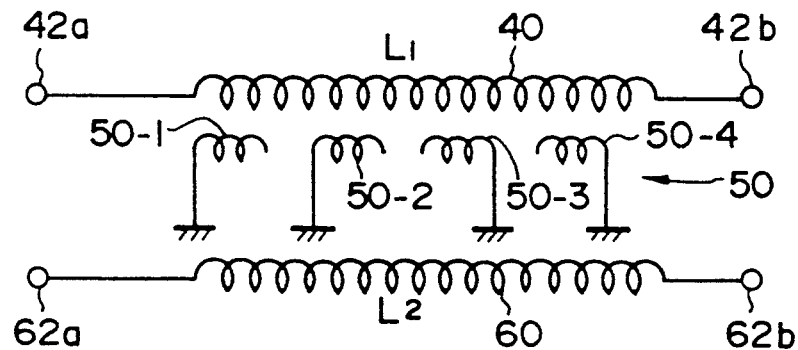

As shown in FIG. 24(b), when an LC element comprises the first and third conductors 40, 60 serving as inductance conductors and the second conductor 50 functioning as a capacitance conductor, the LC element can function as a filter having an excellent attenuation when the second conductor 50 is divided into sections so as to be separately grounded.

OTHER EMBODIMENTS

The invention is not limited to the foregoing embodiments but can be modified in a variety of ways within its scope.

For example, in the foregoing embodiments, the first, second and third conductors 40, 50, 60 are coated on the insulating plates 30, substrates 100 or insulating thin films 200. These conductors 40, 50, 60 may be punched in the shape of the first, second and third conductive elements 44, 54, 64, and then be disposed and attached on the burnt insulating plates 30, substrates 100, and insulating thin films 200.

The following describe the process to laminate copper plates, which are punched so as to form conductive elements on insulating plates 30 made of barium titanate ($BaTiO_3$).

Firstly, square thin films of barium titanate are positioned in an air atmosphere and are burnt for two hours at a temperature of 1250° C. to 1350° C., thereby producing insulating plates 30.

The insulating plates 30, and copper plates punched into the predetermined conductive patterns are bonded as shown in FIG. 10. The bonded plates are the pressed from their both sides with the predetermined pressure. Then the bonded plates are placed in the predetermined neutral atmosphere (reduced atmosphere) are burned at a temperature which is below the melting point temperature of the copper and 1100° C. or less.

The neutral atmosphere is preferably an atmosphere in which the nitrogen is doped with 2 to 100 ppm oxygen. The temperature is set at 1100° C. or less since when it is burned at 1100° C. or more, barium titanate is changed into a semi-conductor because of reaction. Therefore the bonded plates are burnt at the temperature of 950° C. to 1000° C. for the specified period of time.

In this case, a compound having a low melting point such as pyrochlore is produced between the insulating plates 30 made of barium titanate and the copper plates, so that these plates can be firmly bonded.

The more oxygen is doped in the neutral atmosphere, the more the above reaction is accelerated. However when too much oxygen is doped, the surface of the copper plates to function as a terminal is also oxidized, causing poor soldering. Therefore, LC elements which are burnt in the neutral atmosphere having much doped oxygen should be preferably burnt again in the predetermined reduced atmosphere.

The foregoing process enables the production of an excellent laminated LC element which includes the insulating plates 30 made of barium titanate, and the copper plates punched so as to function as the conductive elements 44, 54, 64.

It is conceivable to replace barium titanate with thermoplastics. However, the thermoplastics are susceptible to aging and seems less endurable.

In the foregoing embodiment, the insulating thin films 200 are made by the thin film making method. This invention is not limited to such insulating films. The insulating plates may be made by using insulating sheets which are manufactured by other methods.

In the foregoing description, when it is necessary to increase the inductance of the first, second and third conductors 40, 50, 60, the number of the insulating layers (such as the insulating plates 30 and insulating thin films 200) to be bonded is increased, thereby making the conductors 40, 50, 60 have more turns. The patterns of FIGS. 14 and 15 are adopted for the above purpose. In addition, the conductive elements 44, 54, 64 may be made of a conductive magnetic material such as Fe, or the surfaces of these conductive elements may be stuck magnetic materials, or may be applied with powdery magnetic materials, thereby increasing the inductance L.

In addition to the foregoing examples, a through hole 70 is formed at the center of the laminate 30 so as to insert a magnetic core, and the surface of the laminate 30 is sprayed with powdery magnetic materials, or the laminate 30 is disposed in a magnetic container so that either an open path or a closed path may be formed around the laminate 30 via the through hole 70, as shown in FIGS. 7 and 8.

If necessary, it is possible to change the lengths of the first, second and third conductors 4, 50, 60. For example, the first conductor 40 is made longer than the second conductor 50 so as to make the inductance L large enough.

When it is required to increase the capacitance produced as the distributed constant between the first, second and third conductors 40, 50, 60, the conductive elements 44, 54, 64 are widened so as to increase the area where these conductors face their counterparts.

The capacitance is also increased by composing the insulating layers such as the insulating plates 32 and the insulating thin films 200 with materials having large dielectric constants, and by increasing the number of the insulating layers to be bonded.

In addition, the capacitance can be increased by thinning the insulating layers, or by making the conductors porous by means of the electrolyte capacitor system.

When the LC element according to the invention is used as a normal mode type filter by grounding the second conductor 50, the conductive elements 54 of the second conductor 50 are made wider than the conductive elements 44, 64 of the first and third conductors 40, 60, so that the conductive elements of the second conductor 50 function as a shielding member for the conductive elements 44, 64 so as to effectively prevent leaking of magnetic fluxes and short-circuit between the layers.

The insulating layers such as the insulating plates 32 and insulating thin films 200 ar described to be made of ceramics or plastics. If necessary, these insulating members may be made of electronic wave absorbing/heating elements so as to improve the efficiency of the noise filter in a high frequency band.

The laminated LC element according to this invention is applicable not only to the noise filters but also is applicable to various filters, or varistors.

In addition, the insulating members made of the electronic wave absorbing/heating elements can improve the efficiency of the LC element in a high frequency band.

In the foregoing embodiments, the respective conductors face one another via the insulating layers. If the capacitance as the distributed constant can be produced between the conductors as desired, the positions of these conductors may be dislocated.

Although the thin film making method is employed in the foregoing embodiments, the LC element can also be made by the thick film making method, if necessary.

According to the invention, a plurality of the insulating layers are bonded so as to compose the laminate. The first conductors are disposed so as to extend from an insulating layer to another insulating layer and serve as a coil having the predetermined number of turns. The first conductors face the second conductors via the insulating layers so that they can produce a sufficiently large capacitance between them. A compact, excellent and inexpensive laminated LC element can be obtained in this manner.

Particularly, according to the invention, it is assumed that electrostatic capacity as the distributed constant can be produced between the first and second conductors via the insulating layers, which enables the LC element to be applicable as an LC noise filter which can firmly attenuate and eliminate various noises compared with the conventional concentrated constant type noise filters.

When both of the first and second conductors are used as conductive members, the LC element is applicable as the common mode noise filter. Further when the second conductor is grounded, the LC element can be used as the normal mode noise filter.

When a third conductor is used, the second conductor is grounded and both the first and second conductors are used as the conductive members, the LC element is applicable as a common mode noise filter of a different type.

According to the invention, a plurality of the insulating layers and conductors which are made by the thin film making method are coated on the substrate. Therefore, if the invention is applied together with the semiconductor manufacturing method, both ICs and LC elements can be formed on a wafer. This enables the laminated LC element of the invention as an LC filter to be incorporated in various ICs, so that the ICs including the LC filter can be produced.

What is claimed is:

1. An LC noise filter comprising:
   (a) a laminate including a plurality of bonded insulating plates that function as insulating layers;
   (b) a first conductor including first flat conductive elements which continuously extend around said insulating layers so as to form a coil having a predetermined number of turns; and
   (c) a second conductor including second flat conductive elements which extend around said insulating layers, said second conductor facing said first conductor via said insulating layers to provide a capacitance between said first and second conductors.

2. The LC noise filter according to claim 1, wherein said second conductor is a capacitor conductor having a grounding terminal, said first conductor is an inductor conductor having input/output terminals at both ends, so that the LC noise filter functions as a normal mode type LC noise filter.

3. The LC noise filter according to claim 1, wherein said first and second conductors have input/output terminals at both ends so that the LC noise filter functions as a common mode LC noise filter.

4. The LC noise filter according to claim 1, further comprising a third conductor which includes third conductive elements extending around said insulating layers, facing said second conductive elements via said insulating layers, and producing a capacitance with said second conductor; said second conductor functions as a capacitor conductor including a grounding terminal, and said first and third conductors function as an inductor conductor insulating at their ends input/output terminals.

5. The LC noise filter according to claim 1, wherein said insulating plates have on both sides first and second conductive elements facing each other and are bonded with insulating sheets interposed.

6. The LC noise filter according to claim 2, wherein said insulating plates have on both sides first and second conductive elements facing each other and are bonded with insulating sheets interposed.

7. The LC noise filter according to claim 3, wherein said insulating plates have on both sides first and second conductive elements facing each other and are bonded with insulating sheets interposed.

8. The LC noise filter according to claim 4, wherein said insulating plates have on both sides first and second conductive elements facing each other and are bonded with insulating sheets interposed.

9. The LC noise filter according to claim 1, wherein said laminate comprises first insulating plates having on the surfaces first conductive elements and second insulating plates having on the surfaces second conductive elements, which first and second insulating plates being alternately bonded so that said first conductive elements and said second conductive elements face one another.

10. The LC noise filter according to claim 1, wherein said first and second conductive elements disposed on one of said insulating layers are electrically connected to first and second conductive elements disposed on another insulating layer via through holes disposed on conductive caps, conductive plated layers or insulating layers.

11. The LC noise filter according to claim 4, wherein said first, second and third conductive elements disposed on one of said insulating layers are electrically connected to first, second and third conductive elements disposed on another insulating layer via through holes disposed on conductive caps, conductive plated layers or insulating layers.

12. The LC noise filter according to claim 2, wherein said laminate comprises insulating films which are bonded with ends of said conductive elements exposed, said first and second conductive elements being connected via said exposed ends to first and second conductive elements disposed on said insulating layers.

13. The LC noise filter according to claim 3, wherein said laminate comprises insulating films which are bonded with ends of said conductive elements exposed, said first and second conductive elements being connected via said exposed ends to first and second conductive elements disposed on said insulating layers.

14. The LC noise filter according to claim 1, further comprising a third conductor which includes third conductive elements extending around said insulating layers, facing said second conductive element via said insulating layers and producing a capacitance with said second conductor, whereby said LC element is used as a common mode LC noise filter in which:
   (a) said laminate comprises insulating films as the insulating layers and includes exposed inter-layer element portions;
   (b) said first, second and third conductive elements are connected to first, second and third conductive elements on a next insulating layer via said exposed ends;
   (c) said second conductor serves as a capacitor conductor including a grounding terminal; and
   (d) said first and third conductors are inductor conductors having at both ends input/output terminals.

15. The LC noise filter according to claim 1, wherein surfaces of said insulating layers are finely roughened, and said first and second conductors are coated on said roughened surface.

16. The LC noise filter according to claim 1, wherein said second conductor is sectionally grounded.

17. The LC noise filter according to claim 1, wherein said first conductor extends around insulating layers with a coil diameter changing from one insulating layer to another insulating layer.

18. An electronics device comprising laminated LC elements according to claim 1.

19. A method for manufacturing an LC noise filter, which method comprising:
   (a) a bonding process in which a plurality of insulating film layers are bonded on a substrate;
   (b) an element forming process in which each time insulating layers are laminated, either a first flat conductive element or a second flat conductive element disposed between said insulating layers is coated on one insulating layer to another insulating layer so as to compose a first flat conductor having a specified number of turns and a second flat conductor having a specified number of turns; and
   (c) alternately repeating said processes so as to cause said first flat and second flat conductive elements to face each other via insulating layers in said element forming process.

20. An LC noise filter comprising:
   a laminate having a plurality of bonded insulating layers;

a first conductor having first flat conductive elements which continuously extend around said insulating layers to form a coil having a predetermined number of turns; and a second conductor having second flat conductive elements which extend around said insulating layers, said second conductor facing said first conductor via said insulating layers to provide a capacitance between said first and second conductors, wherein said laminate comprises insulating films which are bonded with ends of said conductive elements exposed, said first and second conductive elements being connected via said exposed ends to first and second conductive elements disposed on said insulating layers.

21. The LC noise filter according to claim 20, wherein said second conductor is a capacitor conductor having a grounding terminal, said first conductor is an inductor conductor having input/output terminals at its both ends, so that the LC element is used as a normal mode type LC noise filter.

22. The LC noise filter according to claim 20, wherein said first and second conductors having input/output terminals at their both ends so as to make the LC element function as a common mode LC noise filter.

23. The LC noise filter according to claim 20, further comprising a third conductor which includes third conductive elements extending around said insulating layers, facing said second conductive element via said insulating layers and producing a capacitance with said second conductor, whereby said LC element is used as a common mode LC noise filter in which:
(a) said laminate comprises insulating films as the insulating layers and includes exposed inter-layer element portions;
(b) said first, second and third conductive elements are connected to first, second and third conductive elements on a next insulating layer via said exposed ends;
(c) said second conductor serves as a capacitor conductor including a grounding terminal; and
(d) said first and third conductors are inductor conductors having both ends input/output terminals.

24. The LC noise filter according to claim 20, wherein said second conductor is sectionally grounded.

25. The LC noise filter according to claim 20, wherein said first conductor extends around insulating layers with a coil diameter changing from one insulating layer to another insulating layer.

26. The electronics device comprising laminated LC elements according to claim 20.

27. An LC noise filter comprising:

a plurality of insulating plates;

a first conductor having a plurality of first conductive elements located on a first side of the insulating plates to form a first coil having a predetermined number of turns;

a second conductor having a plurality of second conductive elements located on a second side of the insulating plates to form a second coil having a predetermined number of turns, the second conductor being opposite the first conductor via the insulating plates to provide a capacitance between the first conductor and second conductors; and a plurality of insulating sheets located between a current turn of the second conductor and a succeeding turn of the first conductor.

28. The LC noise filter of claim 27, wherein holes are provided in the insulating plates and the insulating sheets to connect the plurality of first conductive elements located on the first side of the insulating plates, and connect the plurality of second conductive elements on the second side of the insulating plates.

29. The LC noise filter of claim 27, wherein conductive U-shaped caps clip on the insulating plates to connect the plurality of first conductive elements located on the first side of the insulating plates, and connect the plurality of second conductive elements on the second side of the insulating plates.

30. The LC noise filter of claim 27, wherein the second conductor is a capacitor conductor having a grounding terminal, the first conductor is an inductor conductor having input/output terminals at both ends, so that the LC noise filter functions as a normal mode type LC noise filter.

31. The LC noise filter of claim 30, wherein the first conductor, the second conductor, the plurality of insulating plates and the plurality of insulating sheets are packaged to form a discrete element having three leads.

32. The LC noise filter of claim 27, wherein the first conductor and the second conductor have input/output terminals at both ends so that the LC noise filter functions as a common mode LC noise filter.

33. The LC noise filter of claim 32, wherein the first conductor, the second conductor, the plurality of insulating plates and the plurality of insulating sheets are packaged to form a discrete element having four leads.

34. The LC noise filter of claim 27, wherein the insulating plates are one of ceramics, plastics and synthetic resins.

35. The LC noise filter of claim 27, wherein the first conductive elements and the second conductive elements are formed by process of one of printing, evaporating and plating the insulation sheets.

* * * * *